(12) United States Patent
Parker et al.

(10) Patent No.: US 10,001,513 B2
(45) Date of Patent: Jun. 19, 2018

(54) ELECTRICAL MONITORING SYSTEM

(71) Applicant: Veris Industries, LLC, Tualatin, OR (US)

(72) Inventors: Aaron Parker, Happy Valley, OR (US); Martin Cook, Tualatin, OR (US)

(73) Assignee: Veris Industries, LLC, Tualatin, OR (US)

( * ) Notice: Subject to any disclaimer, the term of this patent is extended or adjusted under 35 U.S.C. 154(b) by 133 days.

(21) Appl. No.: 15/097,832

(22) Filed: Apr. 13, 2016

(65) Prior Publication Data

US 2016/0334471 A1    Nov. 17, 2016

Related U.S. Application Data

(60) Provisional application No. 62/160,996, filed on May 13, 2015.

(51) Int. Cl.
*G01R 31/14* (2006.01)
*G01R 31/28* (2006.01)
*G01R 21/06* (2006.01)
*G01R 22/06* (2006.01)

(52) U.S. Cl.
CPC ............ *G01R 21/06* (2013.01); *G01R 22/068* (2013.01)

(58) Field of Classification Search
CPC .............................. G01R 21/06; G01R 22/068
See application file for complete search history.

(56) References Cited

U.S. PATENT DOCUMENTS

| | | | |
|---|---|---|---|
| 5,708,551 A * | 1/1998 | Bosatelli | H01R 13/641 307/38 |
| 6,397,155 B1 * | 5/2002 | Przydatek | G01R 22/00 324/142 |
| 6,826,369 B1 * | 11/2004 | Bondarev | H04B 10/1143 398/106 |
| 7,136,591 B2 * | 11/2006 | Bondarev | G08C 17/02 398/106 |
| 7,612,552 B2 * | 11/2009 | Dent | G01R 25/005 324/142 |
| 8,527,105 B1 * | 9/2013 | Choong | G01D 4/004 315/294 |
| 8,570,909 B1 * | 10/2013 | Shaffer | H04L 43/0811 370/260 |
| 9,329,659 B2 * | 5/2016 | Cook | G01R 21/133 |
| 9,506,952 B2 * | 11/2016 | Cook | G01R 21/133 |
| 9,689,899 B2 * | 6/2017 | Cook | G01R 15/142 |
| 9,778,290 B2 * | 10/2017 | Moon | G01R 19/0092 |
| 9,804,211 B2 * | 10/2017 | Parker | G01R 21/133 |
| 2004/0021452 A1 * | 2/2004 | Hwang | G01R 31/041 324/66 |
| 2004/0227503 A1 * | 11/2004 | Bowman | G01R 15/14 324/142 |
| 2004/0249485 A1 * | 12/2004 | Bondarev | G08C 17/02 700/71 |

(Continued)

OTHER PUBLICATIONS

Veris, H8035 & H8036 Series, 2012, Veris Industries. www.veris.com.*

(Continued)

*Primary Examiner* — Jermele M Hollington
*Assistant Examiner* — Sean Curtis
(74) *Attorney, Agent, or Firm* — Chernoff Vilhauer LLP

(57) ABSTRACT

An electrical monitoring system that includes non-binary indications.

6 Claims, 26 Drawing Sheets

(56) References Cited

U.S. PATENT DOCUMENTS

| | | | | |
|---|---|---|---|---|
| 2005/0096756 A1* | 5/2005 | Quast | F15B 13/0839 | 700/19 |
| 2006/0212238 A1* | 9/2006 | Nisenblat | G01R 13/0209 | 702/66 |
| 2007/0038394 A1* | 2/2007 | Gagnon | G01D 4/008 | 702/61 |
| 2007/0200552 A1* | 8/2007 | Fritz | G01R 21/06 | 324/142 |
| 2009/0295370 A1* | 12/2009 | Parker | G01R 21/00 | 324/140 R |
| 2010/0176960 A1* | 7/2010 | Bitsch | G01R 19/16547 | 340/664 |
| 2010/0207604 A1* | 8/2010 | Bitsch | G01R 21/133 | 324/140 R |
| 2010/0264944 A1* | 10/2010 | Rupert | G01R 11/02 | 324/706 |
| 2010/0308792 A1* | 12/2010 | Rupert | G01R 21/133 | 324/76.77 |
| 2011/0131793 A1* | 6/2011 | Woodbury | G01R 15/18 | 29/592.1 |
| 2011/0156698 A1* | 6/2011 | Cook | G01R 15/185 | 324/127 |
| 2012/0217954 A1* | 8/2012 | Cook | G01R 19/2513 | 324/123 R |
| 2012/0221278 A1* | 8/2012 | Cook | G01R 21/133 | 702/107 |
| 2012/0259566 A1* | 10/2012 | Finch | G01R 21/06 | 702/62 |
| 2012/0310557 A1* | 12/2012 | Bowman | G01R 35/04 | 702/61 |
| 2013/0124122 A1* | 5/2013 | Cook | H02S 50/10 | 702/64 |
| 2014/0002169 A1* | 1/2014 | Ramirez | H03B 1/00 | 327/299 |
| 2014/0184198 A1* | 7/2014 | Cook | G01R 21/133 | 324/107 |
| 2014/0223218 A1* | 8/2014 | Cook | G01R 21/133 | 713/340 |
| 2014/0333294 A1* | 11/2014 | Bruel | G01R 22/061 | 324/140 R |
| 2014/0343742 A1* | 11/2014 | Bruel | G01R 21/06 | 700/291 |
| 2015/0316595 A1* | 11/2015 | Creekmore | H01H 9/181 | 324/103 R |
| 2016/0313381 A1* | 10/2016 | Behringer | G01R 19/2513 | |
| 2016/0334471 A1* | 11/2016 | Parker | G01R 21/06 | |
| 2017/0184641 A1* | 6/2017 | Cook | G01R 21/06 | |
| 2017/0184697 A1* | 6/2017 | Kostrba | G01R 35/005 | |
| 2017/0187836 A1* | 6/2017 | Kostrba | H04L 47/25 | |
| 2017/0242059 A1* | 8/2017 | Parker | G01R 21/133 | |
| 2017/0248639 A1* | 8/2017 | Vaughn | G01R 21/006 | |
| 2017/0254836 A1* | 9/2017 | Cook | G01R 21/133 | |

OTHER PUBLICATIONS

Veris, H8035 & H8036—Power Monitoring Installation Guide, 2011, Veris Industries. www.veris.com.*

Siemens, MD Model Power Meter—User Guide, Oct. 2013—Copyright—Siemens Industry, Inc.*

* cited by examiner

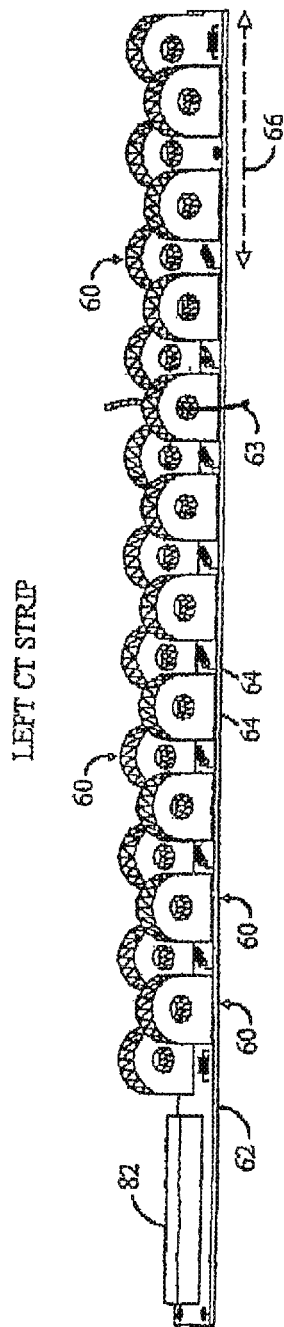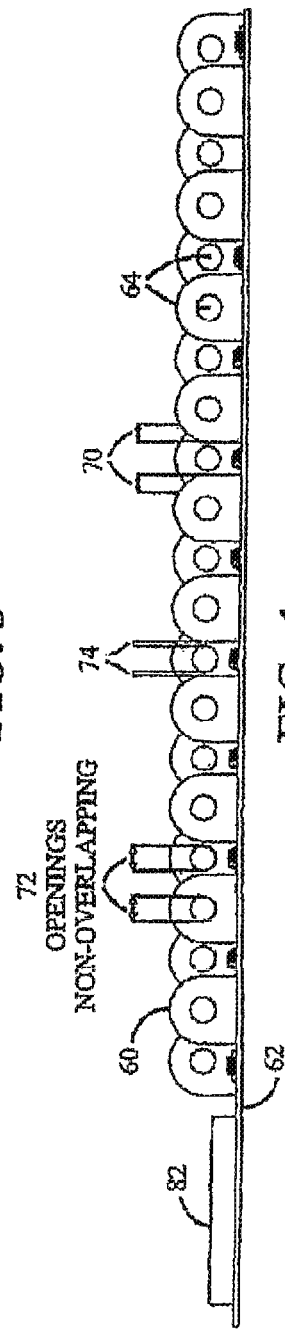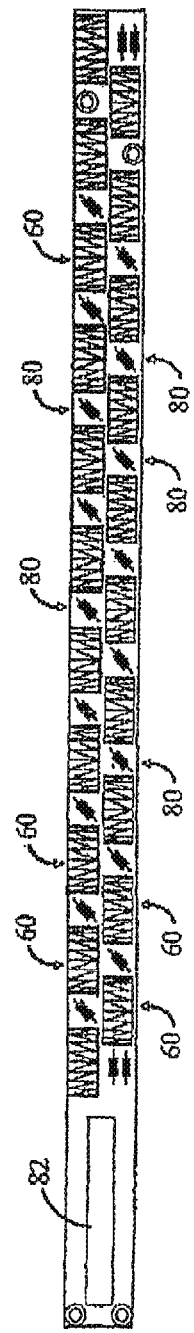

| # of States | | | | |
|---|---|---|---|---|
| 1 | Red | | | |
| 1 | | Green | | |
| 2 | Red | Green | | |
| 3 | Red | Yellow | Green | |
| 4 | Red | Yellow | Green | Blue |

FIG. 10

| # of States | Colors | Alarms | Levels | Levels | Indications |
|---|---|---|---|---|---|
| 1 | Red | Alarm | High High | Very Low | Off |
| 2 | Yellow | Warning | High | Low | |
| 3 | Green | Normal | Normal | Normal | On |
| 4 | Blue | | Low | | |

| Pause | Parameter = 3, warning state | Pause | Parameter = 3, warning state |
|---|---|---|---|
| Off | On \| Off \| On \| Off \| On | Off | On \| Off \| On \| Off \| On \| Off |

On = Yellow

FIG. 35

| Pause | Parameter = 8, normal state |
|---|---|
| Off | On \| Off \| On \| Off \| On \| Off \| On \| Off \| On \| Off |

On = Green

FIG. 36

| Pause | Norm 1 | Pause | Norm 1 | Pause |
|---|---|---|---|---|
| Off | On | Off | On | Off |

On = Green

FIG. 37

| Pause | Alarm -1 | Pause | Alarm -1 | Pause |
|---|---|---|---|---|
| Off | On | Off | On | Off |

On = Red

FIG. 38

FIG. 39 — Pause | Parameter = -3, warning state | Pause | Parameter = -3, warning state
Off | On | Off | On | Off | On | Off | On | Off | On | Off
On = Yellow FIG. 40 — Pause | +8 normal state
Off | On | Off | On | Off | On | Off | On | Off | On | Off
On = Green FIG. 41 — Alarm State, Parameter at -30% | Pause
On | Off | On | Off | On | Off
On = Red FIG. 42 — Normal State, Parameter at +90% | Pause
On | Off | On | Off | On | Off | On | Off | On | Off | Off
On = Green

| Parameter | Units | Notes |
|---|---|---|
| Power Factor | PF | For an Energy Meter, a low power factor can indicate a voltage input is miss-associated with a current sensor. Power factor is a ratio that can range from 1 to 0 (or -1 to +1 on a bi-directional meter) and can be expressed as a percentage with 1 being 100%. |
| Current | A | May be represented as a percent of the meter's current rating or the circuit's breaker rating. |
| Voltage | V | Line to Line and Line to Neutral. May be represented as a percent of the circuit's voltage rating. |
| Power | kW | Real (watts), Reactive (VAR), and Apparent Power. |
| Diagnostic Error Codes | Integer | Information, warnings, alarms, diagnostics, error codes. |
| Thd | % | Current or Voltage |
| Crest Factor | Ratio | Current or Voltage |
| Frequency | Hz | |

FIG. 43

| State | # of States | | Notes |
|---|---|---|---|
| Low Power Factor | 3 | Normal (Green), low (Yellow), Very Low (Red) | Diagnostic used to identify miss associated Voltage Inputs and CTs, or an excessively inductive or capacitive load. |
| Over Current | 3 | Normal (Green), Warning (yellow), Over (Red) | Combined with a threshold parameter such as the circuit breaker size, can warn of impending breaker disconnect. |
| Over Voltage | 3 | Normal (Green), Warning (yellow), Over (Red) | Voltage over threshold or too large to measure. |
| Phase Loss / Under Voltage | 3 | Normal (Green), Warning (yellow), Low (Red) | Voltage on one or more phase has fallen below a threshold. |
| System Status | 3 | Normal (Green), Warning (Yellow), Alarm (Red) | Applies to the system as a whole. May be combined with blinked out error code numbers. |
| High Thd | 3 | Normal (Green), Warning (Yellow), Alarm (Red) | |
| High Crest Factor | 3 | Normal (Green), Warning (Yellow), Alarm (Red) | |
| Frequency | 3 | Normal (Green), Warning (Yellow), Alarm (Red) | |

FIG. 44

Phase 1
Pause | Off | On | Off | On | Off | On | Off | On | Off | On | Off | On | Off | On | Off PF at +90%, State is PF Normal On = Green Phase 2
Pause | Off | On | Off | On | Off | On | Off | On | Off PF at -60%, State is Low PF Warning On = Yellow Phase 3
Pause | Off | On | Off | On PF at +40%, State is Low PF Alarm On = Red

FIG. 45

Example 1 — Voltage is over 120% of circuit rating, State is Over Voltage Alarm, Blinking is continuous without pause

| Off | On | Off | On | Off | On | Off | On | Off | On | Off | On | Off | On |
|---|---|---|---|---|---|---|---|---|---|---|---|---|---|

On = Red

Example 2 — Voltage is at 110% of circuit rating, State is Over Voltage Warning

| Off | On | Off | On | Off | On | Off | On | Off | On | Off | Off |
|---|---|---|---|---|---|---|---|---|---|---|---|

On = Yellow

Example 3 — Voltage is at 100% of circuit rating, State is Normal

| Off | On | Off | On | Off | On | Off | On | Off | On | Off | On |
|---|---|---|---|---|---|---|---|---|---|---|---|

On = Green

Example 4 — Voltage is at 90% of circuit rating, State is Under Voltage Warning

| On | Off | On | Off | On | Off | On | Off | On | Off | On | Off |
|---|---|---|---|---|---|---|---|---|---|---|---|

On = Yellow

Example 5 — Voltage is at 70% of circuit rating, State is Under Voltage Alarm

| On | Off | On | Off | On | Off | On | Off | Off |
|---|---|---|---|---|---|---|---|---|

On = Red

FIG. 47

Example 1

| Off | On | Off | On | Off | On | Off | On | Off | On | Off |
|---|---|---|---|---|---|---|---|---|---|---|

Power is at 90%, State is Over Power Alarm

On = Red

Example 2

| Off | On | Off | On | Off | On | Off | On | Off | Off |
|---|---|---|---|---|---|---|---|---|---|

Power is at 70%, State is Over Power Warning

On = Yellow

Example 3

| Off | On | Off | On | Off | On | Off | On | Off |
|---|---|---|---|---|---|---|---|---|

Power is at 50%, State is Normal

On = Green

Example 4

| Off | On | Off | On | Off |
|---|---|---|---|---|

Power is at 30%, State is Under Power Warning

On = Yellow

Example 5

| Off | On |
|---|---|

Power is at 10% or less, State is Uner Power Alarm

On = Red

FIG. 48

Example 1 Power is at +110% (direction is to load), State is Downstream Over Power Alarm

| Off | On | On | Off | Off | On | On | Off | Off | On | On | Off | Off | On | On | Off | Off | On | On | Off |

On = Red

Example 2 Power is at +80% (direction is to load), State is Downstream Normal

| Off | On | Off | On | Off | On | Off | On | Off | On | Off | On | Off | On | Off | On | Off | | | |

On = Green

Example 3 Power is at +30% (direction is to load), State is Downstream Under Power Alarm

| Off | On | Off | On | | | | | | | | | | | | | | | | |

On = Yellow

Example 4 Power is at -120% (direction is to grid), State is Upstream Over Power Alarm

| On | Off | Off | On | On | Off | Off | On | On | Off | Off | On | On | Off | Off | On | On | Off | Off | On |

On = Red

Example 5 Power is at -70% (direction is to grid), State is Upstream Normal

| On | Off | On | Off | On | Off | On | Off | On | Off | On | Off | Off | | | | | | | |

On = Green

Example 6 Power is at -10% (direction is to grid), State is Upstream Under Power Alarm

| On | | | | | | | | | | | | | | | | | | | |

On = Yellow

FIG. 49

| Category | Code |
|---|---|
| Information | 1 |
| Warning | 3 |
| Alarm | 2 |
| Information | 4 |

FIG. 50

ELECTRICAL MONITORING SYSTEM

CROSS-REFERENCE TO RELATED APPLICATIONS

This application claims the benefit of U.S. Provisional Application No. 62/160,996, filed May 13, 2015.

BACKGROUND OF THE INVENTION

The present invention relates to an electrical monitoring system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, and 16c, etc. which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips. When the load 18 interconnected to a respective circuit breaker 16 within the power panel 10 draws excessive electrical current then the circuit breaker 16 trips or otherwise disconnects the electrical power to the load 18. In this manner, if a load shorts and thereafter draws excessive current then the circuit breaker will trip. Frequently the load will be a three-phase load having three wires provided thereto, with one or more corresponding circuit breakers. Otherwise, the loads are typically single phase or two phases.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound torodial coils on a metallic or non-metallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Another support more suitable for the right hand side of the circuit breakers may also be used. Then, the wires from the loads are passed through the respective sensors and interconnected to a respective circuit breaker 16. In addition, the wires 23a, 23b, and 23c, for sensing the voltage potentials on the bus bars are likewise electrically interconnected. The support 62 may be suitable for supporting a set of electrical traces that interconnect the sensors 60 to a connector 82. A cable 84 interconnects each connector 82 to a power monitor 24. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps.

Referring to FIG. 8, another power meter configuration includes a generally portable handheld power meter 800. The power meter 800 may include three voltage phase inputs, namely, voltage phase A 810a, voltage phase B 810b, and voltage phase C 810c. The power meter 800 may also include three current phase inputs, namely, current phase A 820a, current phase B 820b, and current phase C 820c. By combining the corresponding voltage and current phases, a three phase power measurement may be determined. The power meter may also be used to sense single phase parameters and two phase parameters. Also, power factors, current levels, and voltage levels may be determined. However due to the limited spatial room, visual indications of the state of the meter may be provided to the user in the form of a binary state of a plurality of light emitting diodes 830a, 830b, 830c. While the use of such light emitting diodes may pass on information, it is desirable to provide additional information using visual indicators.

What is desired, therefore, is an effective electrical monitoring system.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 3 illustrates a perspective view of a support for a set of current sensors.
FIG. 4 illustrates a side view of the support and sensors of FIG. 3.
FIG. 5 illustrates a top view of the support and sensors of FIG. 3.
FIG. 10 illustrates led states.
FIG. 11 illustrates led states, colors, alarms, indications, and levels
FIG. 15 illustrates led blinks with a long duty cycle representing 90% or more.
FIG. 16 illustrates led blinks with a long duty cycle representing 66% to 90%,
FIG. 17 illustrates led blinks with a 50/50 duty cycle representing 33% to 66%.
FIG. 18 illustrates led blinks with a short duty cycle representing 10% to 33%.
FIG. 22 illustrates led indicating a channel number and parameter count.
FIG. 23 illustrates dual led indicators indicating a channel number and parameter count.
FIG. 24 illustrates a led indicator for each channel of a particular color.

FIG. 35 illustrates a led indicating a warming state of 3.
FIG. 36 illustrates a led indicating normal state of 8.
FIG. 37 illustrates a led with a normal state of 1.
FIG. 38 illustrates a led with an alarm state of −1.
FIG. 39 illustrates a led with a warning state of −3.
FIG. 40 illustrates a led with a normal state of 8.
FIG. 41 illustrates a led with an alarm state at −30%.
FIG. 42 illustrates a led with a normal state of +90%.
FIG. 43 illustrates a set of parameters, units, and descriptions.
FIG. 44 illustrates a set of state, a number of states, a set of color indications, and descriptions.
FIG. 45 illustrates a set of led values indicating power factors.
FIG. 47 illustrates a set of led values indicating warning thresholds.
FIG. 48 illustrates a set of led values indicating power thresholds.
FIG. 49 illustrates a set of led values indicating power alarms.
FIG. 50 illustrates a set of led values indicating state information.

DETAILED DESCRIPTION OF PREFERRED EMBODIMENT

Figure 1:
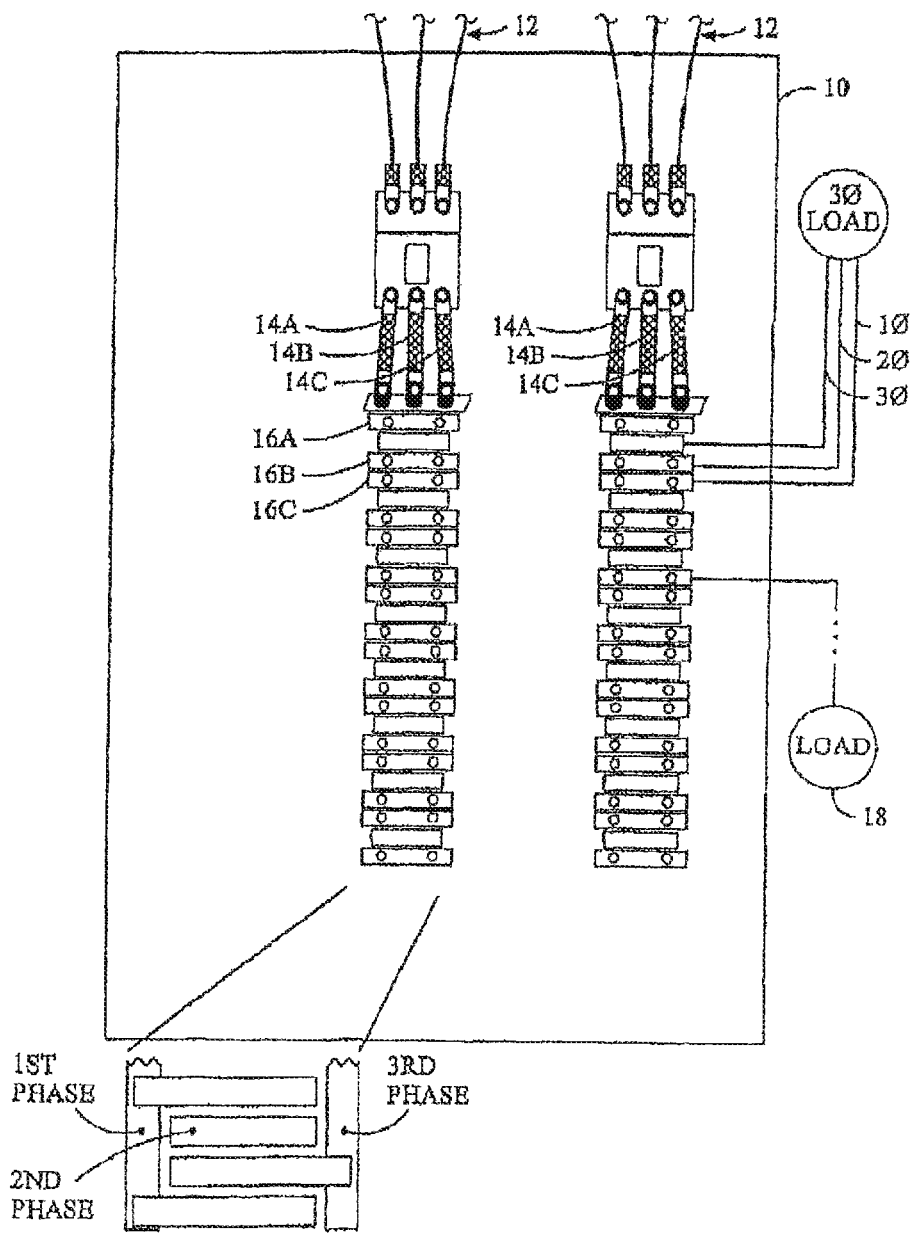
FIG. 1 illustrates a power panel with circuit breakers.
Figure 2:
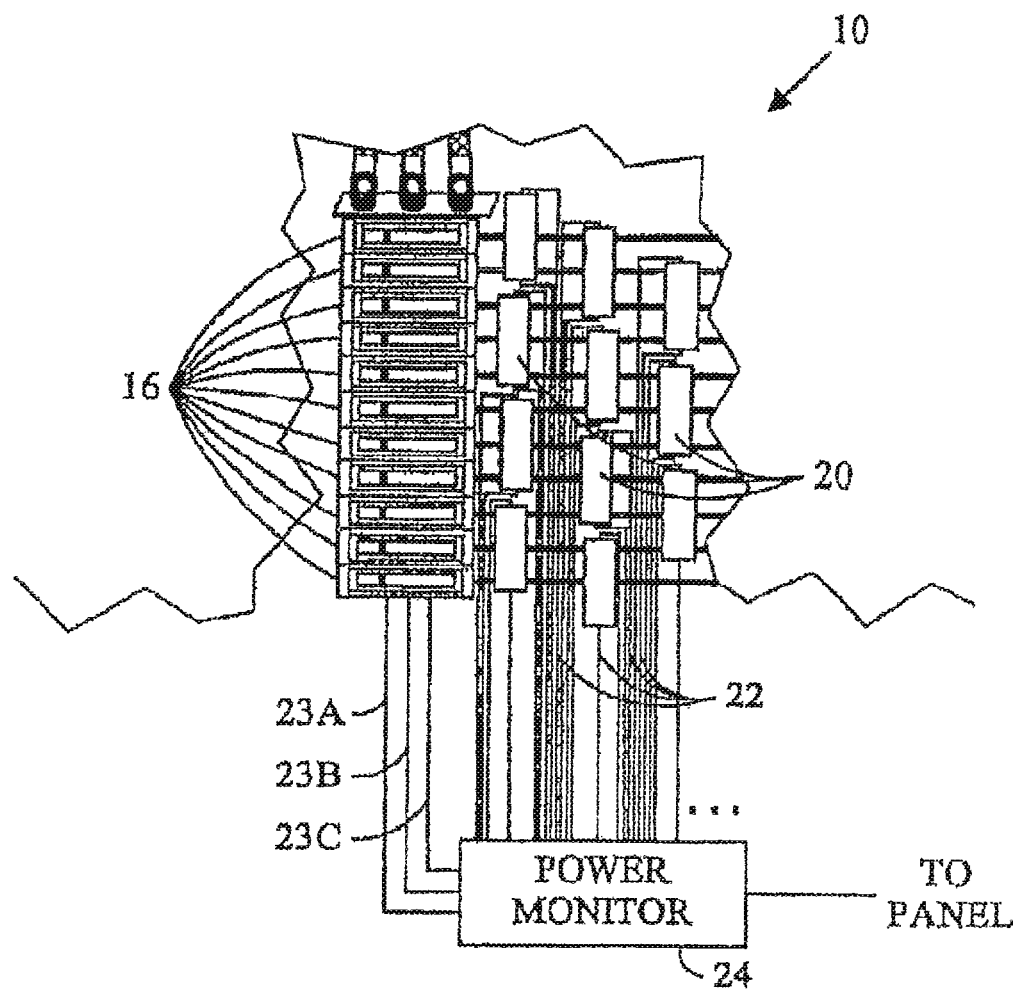
FIG. 2 illustrates circuit breakers, associated sensors, and a power monitor.
Figure 6:
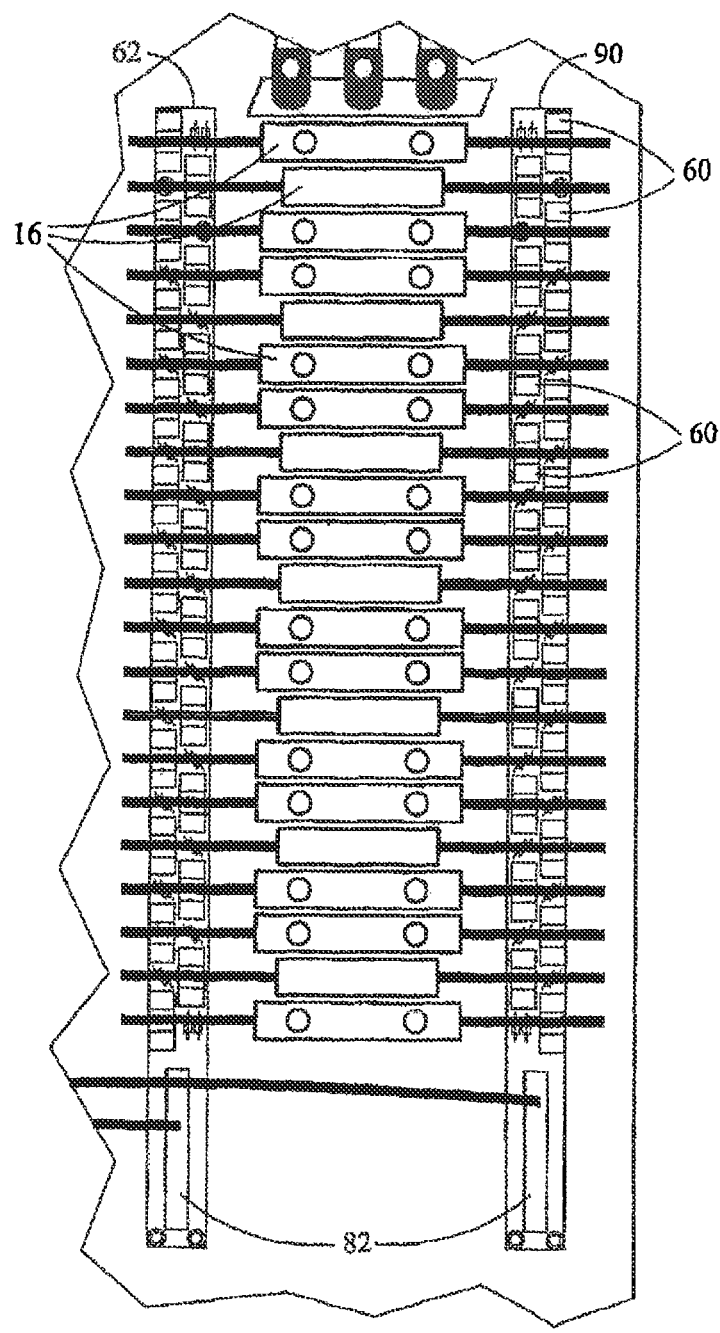
FIG. 6 illustrates a top view of the support and sensors of FIG. 2 together with circuit breakers.
Figure 7:
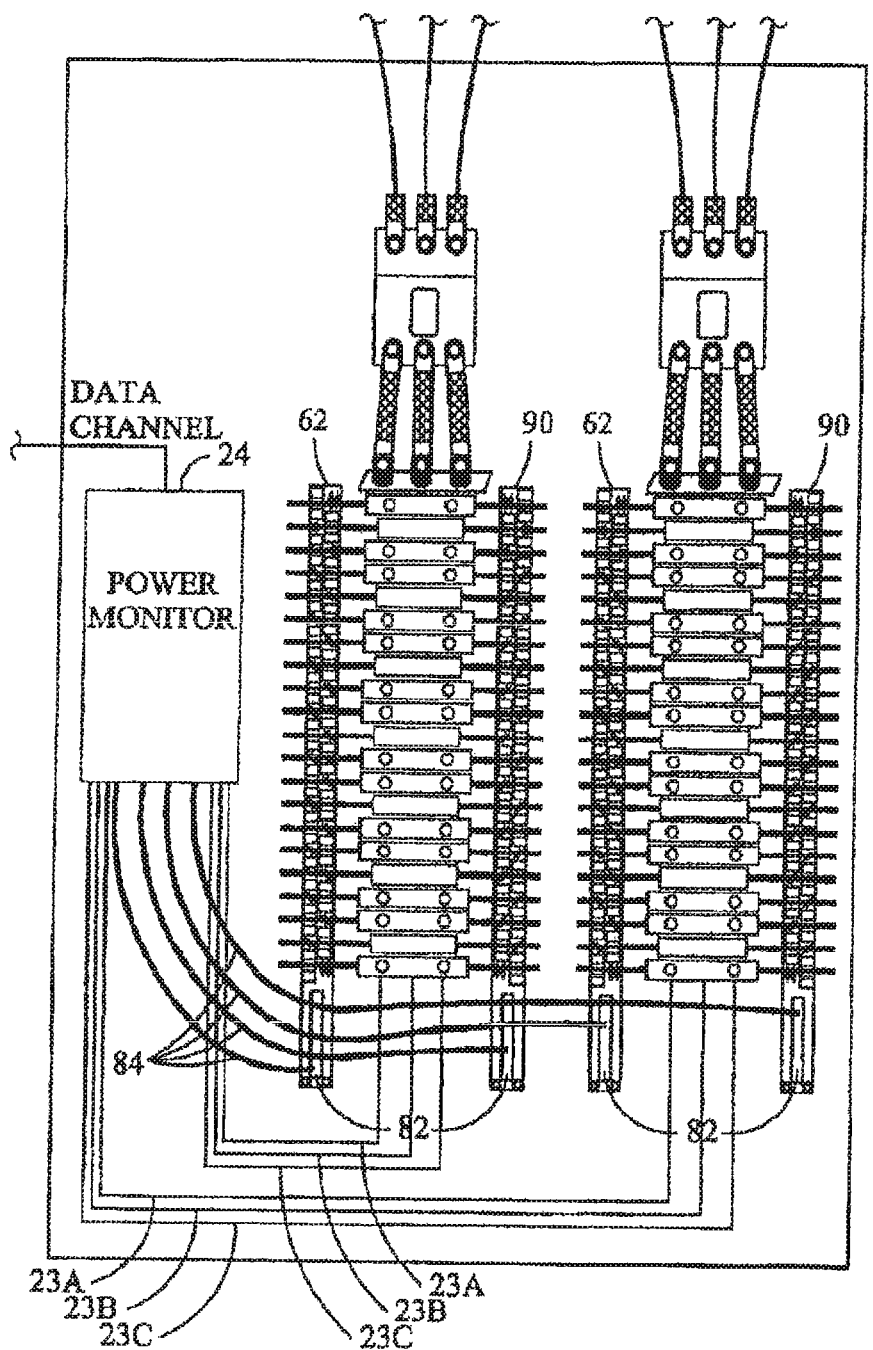
FIG. 7 illustrates a power panel assembly with a power monitor and the support/current sensors of FIG. 3.
Figure 8:
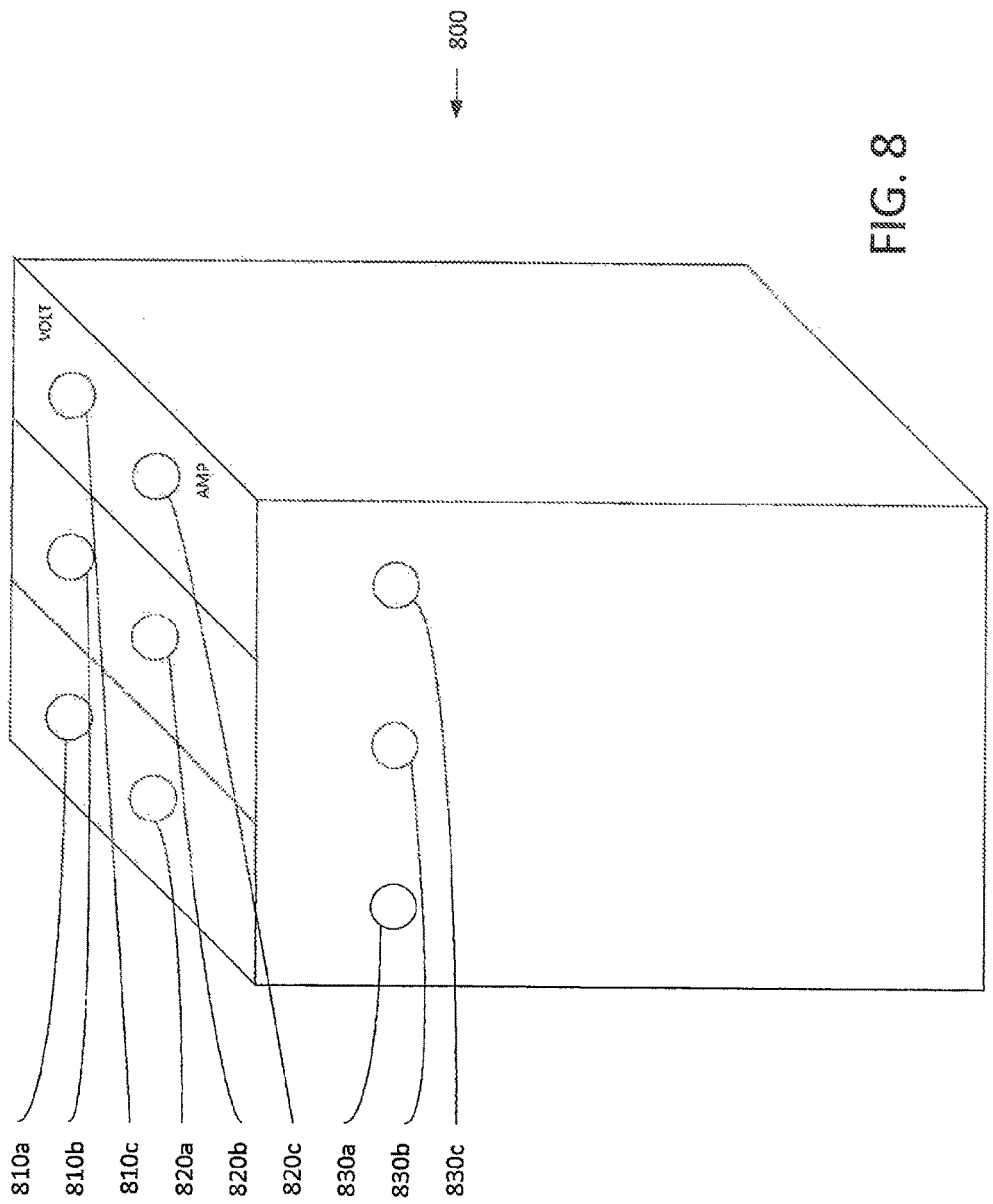
FIG. 8 illustrates a portable power meter.
Figure 9:
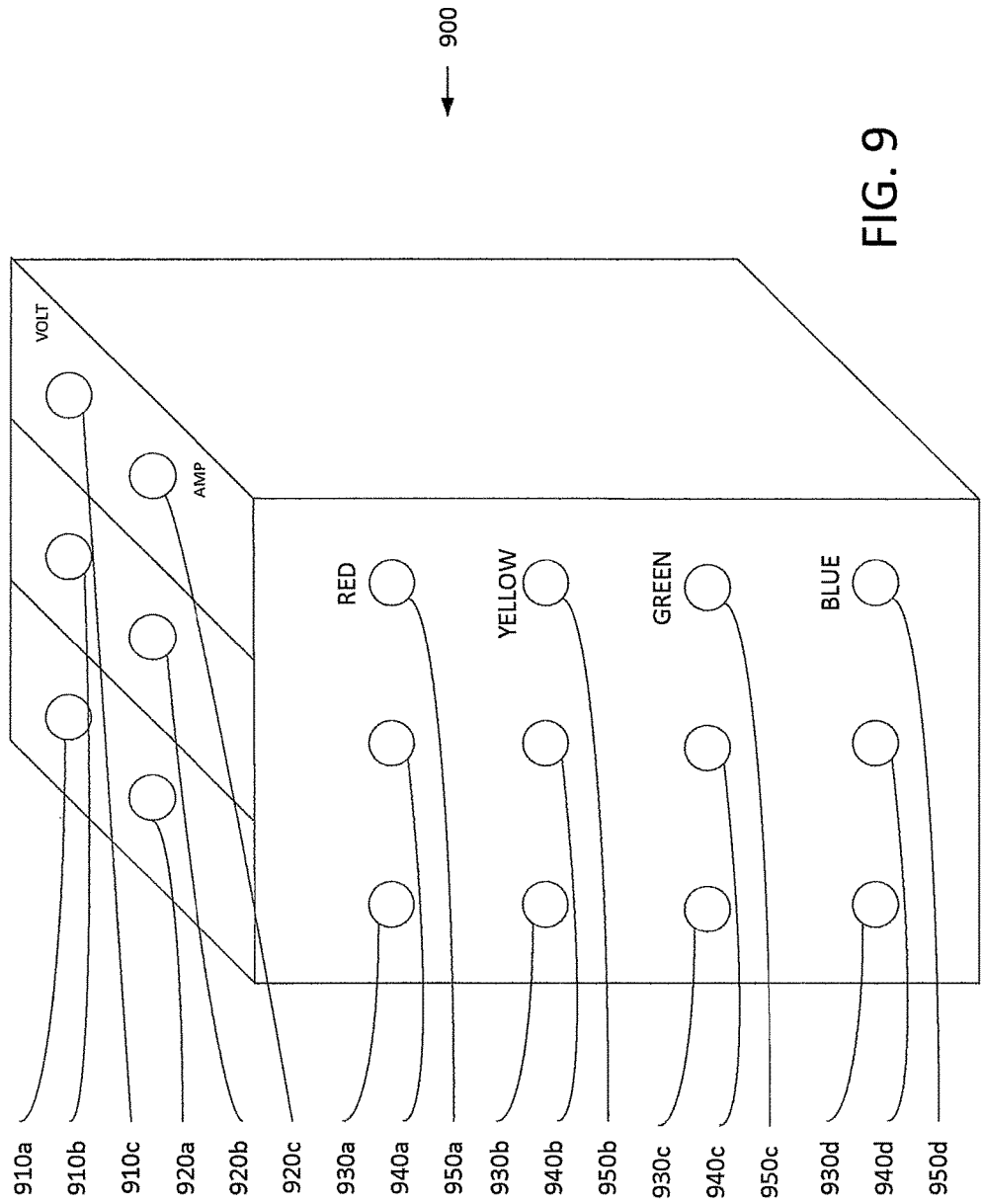
FIG. 9 illustrates another portable power meter.

Referring to FIG. 9, a power metering device 900 may include one or more connectors 910a, 910b, 910c to receive the voltage signals of one or more phases. The power metering device 900 may also include one or more connectors to receive current signals 920a, 920b, 920c of one or more phases corresponding to the voltage signals of the one or more phases. For example, connectors 910a, 920a may correspond with each other, connectors 910b, 920b may correspond with each other, and connectors 910c, 920c may correspond with each other. The power metering device 900 may determine single phase, two phase, and/or three phase measurements. The power metering device may also include a corresponding set of light emitting diodes for one or more phases. For example, phase A may have a set of red led A 930a, yellow led A 930b, led green led A 930c, and blue led A 930d. For example, phase B may have a set of red led B 940a, yellow led B 940b, green led B 940c, and blue led B 940d. For example, phase C may have a set of red led C 950a, yellow led C 950b, green led C 930d, and blue led D 950d. There is only a limited amount of information that may be effectively communicated by using a binary signaling of a set of light emitting diodes. Accordingly, it is desirable to include a non-binary set of indications regarding the characteristics of the electrical system using what is inherently a set of binary devices, namely, light emitting diodes. It is to be understood that other lighting devices may likewise be used, as desired.

The power monitoring device may provide non-binary indications, and may comprise any indicator that has a readily ascertainable on state and off state, where the on state corresponds to an indication that the corresponding criterion or value is satisfied and where the off state corresponds to an indication that the corresponding criterion or value is not satisfied. A combination of such indications provides a non-binary indication of characteristics of the electrical system. To provide examples but not limitations, each indicator may comprise: a single light bulb, light emitting diode (LED), or other light-emitting device, where on corresponds to the on state, and off corresponds to the off state; a single light bulb, LED, or other light-emitting device capable of being illuminated in two or more colors, where each color corresponds to one of the states; a single light bulb, LED. or other light-emitting device, that illuminates at two or more intensities, each intensity corresponding to one of the states; one or more strobe lights that flashes or strobes at two or more different rates and/or frequencies, each rate corresponding to one of the states; one or more speakers that emits one or more sounds (such as pitch or amplitude), where the on state corresponds to emission of the first sound, and the off state corresponds to the lack of sound emission; a speaker programmed by a processor to emit one or more sounds, different in some aspect (such as pitch, amplitude, etc.), where each sound corresponds to one of the on and off states; and so forth. Any indicator that provides an indication to a user via one of her five senses may be used.

Referring to FIG. 10, the four different color leds for each phase may generally indicate a particular state of the device. For example, illuminating just the red led of the set of four leds may indicate a single state, namely, a warning condition, an off condition, or the like. For example, illuminating just the green led of the set of four leds may indicate a single state, namely, an operating condition, a normal condition, an on condition, an okay condition, or the like. For example, illuminating just the red and green leds of the set of four leds may indicate two states, namely, an off/on state, an abnormal/normal state, and the like. For example, illuminating just the red, yellow, and green leds of the set of four leds may indicate three states of the device, namely, an alarm condition, a warning condition, and a normal condition. For example, illuminating all of the four leds may indicate four states, namely, a range, such as a high high value, a high value, a normal value, and a low value. In some configurations, one or more of the colors may be achieved through a combination of other colors, such as for example, the combination of red and green has the appearance of yellow.

Referring to FIG. 11, the four different color leds for each phase may generally indicate a particular condition level of the device. For example, the red led may indicate an alarm condition, such as high high level and/or very low level and/or off. For example, the yellow led may indicate a warning condition, such as high level and/or low level. For example, the green led may indicate a normal condition, such as normal and/or on. For example, the blue led may indicate a range such as low.

Figure 12:
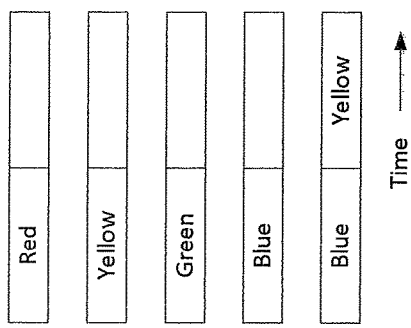
FIG. 12 illustrates led blinks with a 50/50 duty cycle.

Referring to FIG. 12, blinks of one or more leds may be used to indicate the numeric value of a parameter or measurement, percentages, or fractions. A blink consists of a light on time and an off time, both easily discernable by the human eye. The indicator may include a selected color of the light emitted and the off time as a black. In this example, the on and off times are roughly equal, also known as a 50/50 duty cycle. Also, a duty time between any other two or more colors may likewise be used.

The duration of the blink can also be used to indicate an approximate value, a sign or direction. The on/off cycle length is constant, but the ratio of the on/off time is varied. Used by themselves, duration blinks are continuous.

Figure 13:
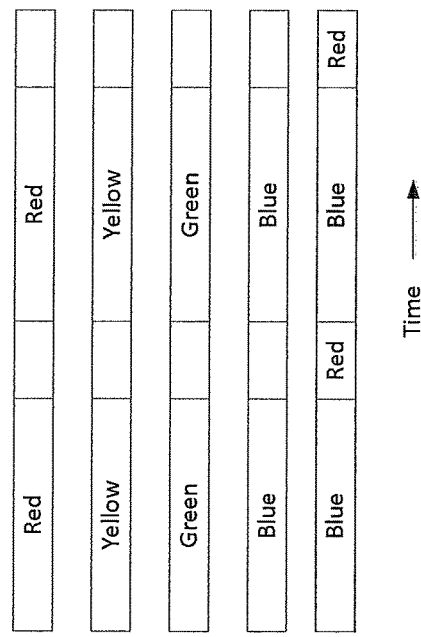
FIG. 13 illustrates led blinks with a long duty cycle.

Referring to FIG. 13, to represent a large value, positive sign or forward direction the blink duty cycle could be long. Also, two or more colors may likewise be used.

Figure 14:
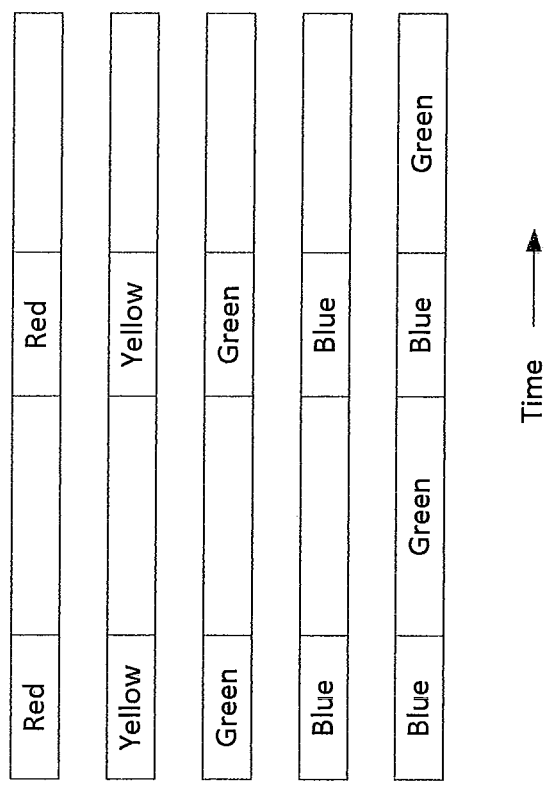
FIG. 14 illustrates led blinks with a short duty cycle.

Referring to FIG. 14, to represent a small value, negative sign or reverse direction the blink duty cycle could be short. Also, two or more colors may likewise be used.

A multi-level duration may be used which allows the duration to represent more than two states, but the number of steps should be limited due to people's ability to distinguish the difference. Five steps are illustrated in FIGS. 15-19, although the actual implementation may vary the duration over a range continuously without steps. This indication is intended to provide a sense of the parameter value, but not a precise number.

Figures 15, 16:
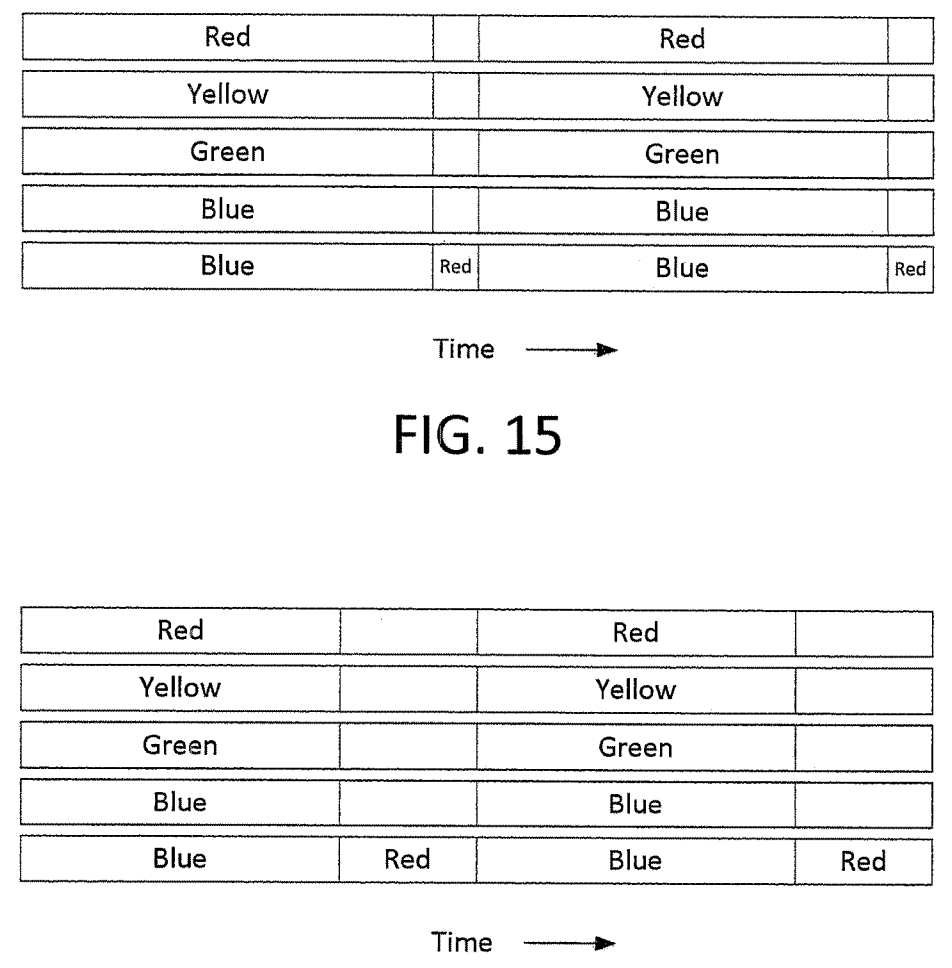

Referring to FIG. 15, to represent a very large value of 90% or greater the blink duration (duty) cycle is very long with a very short off time. Also, two or more colors may likewise be used.

Referring to FIG. 16, to represent a large value of 66% to 90%, the blink duration would be long and the off time grows. Also, two or more colors may likewise be used.

Figures 17, 18:
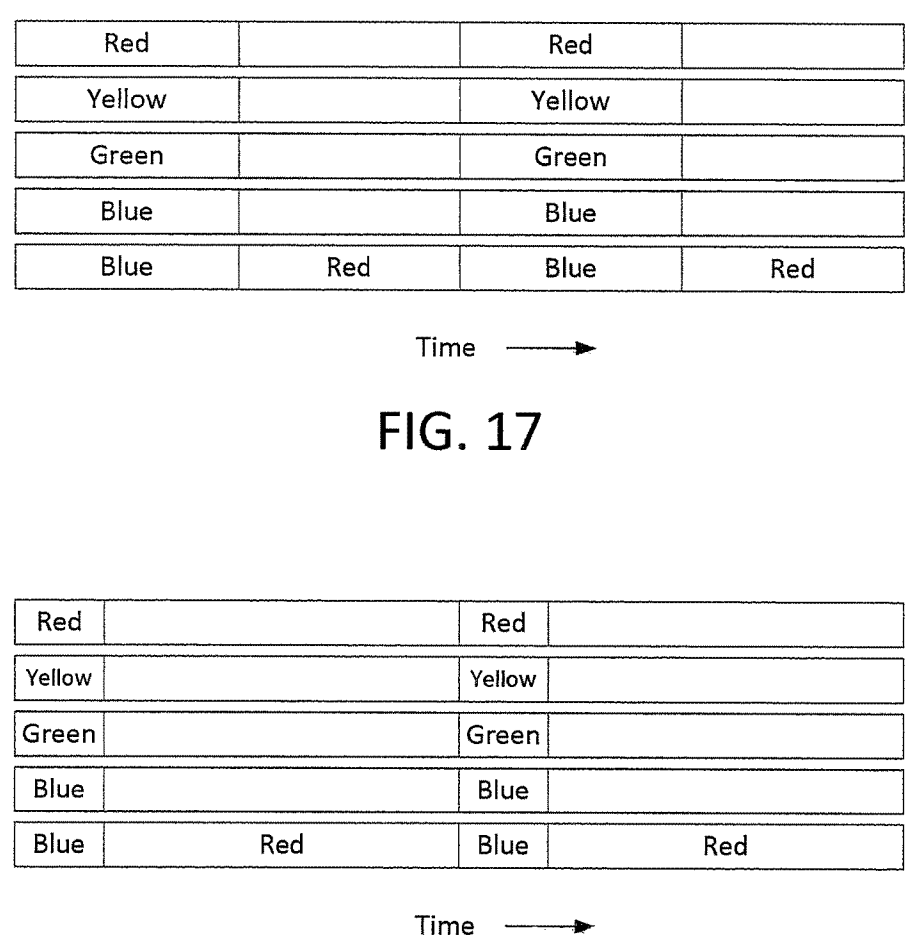

Referring to FIG. 17, to represent a medium value of 33% to 66% a 50/50 duty cycle would be used. Also, two or more colors may likewise be used.

Referring to FIG. 18, to represent a small value of 10% to 33%, the blink duty cycle would be short. Also, two or more colors may likewise be used.

Figure 19:
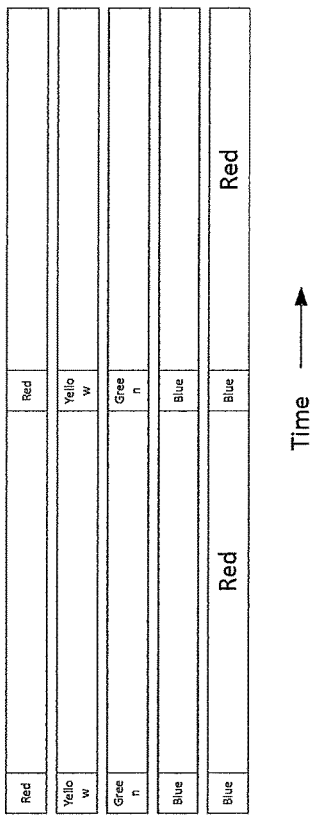
FIG. 19 illustrates led blinks with a very short duty cycle representing less than 10%.

Referring to FIG. 19, to represent a very small value of less than 10% the blink duty cycle is very brief with a long off time. Also, two or more colors may likewise be used.

Blinks may be used to count out values. Variable length numeric values may be delineated with pauses. Values with fixed maximums (such as a percentage) can have a fixed period, with optional pauses.

Figure 20:
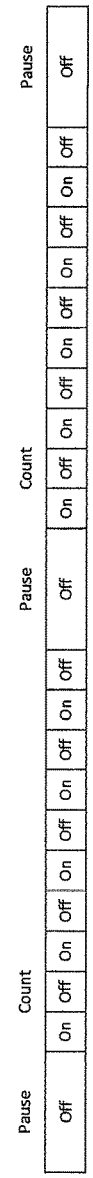
FIG. 20 illustrates led blinks to count out the absolute numeric value.

Referring to FIG. 20, the system may count out the absolute numeric value of a parameter with blinks, together with a particular color, if desired. The number of blinks may be variable. A fixed pause between blink counts delineates the end of a count cycle and the beginning of another. Large numbers may be rounded and expressed in blinks with significance of 2, 5, 10, 100 etc. to reduce the number of blinks required count them out. For example, to show the number 50 with a blink significance of 10 the pattern illustrated in FIG. 20 may be used. The pattern may repeat endlessly, with the pause times staying constant, but the count fields may change the number of blinks (and length in time) as the parameter changes value.

Figure 21:
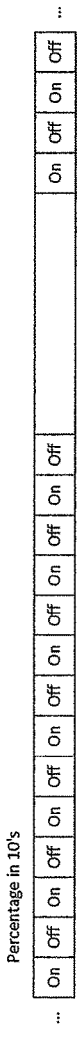
FIG. 21 illustrates led blinks to count out a percentage or ratio

Referring to FIG. 21, the system may count out a percentage and/or ratio with blinks, together with a particular color, if desired. The number of blinks is variable, but the cycle may be always of a fixed number of blink periods. A fixed length pause may be optionally added between blink periods. Percentages may be represented as a count of 10's. For example, to represent a parameter at 70% of full scale in increments of 10% on a scale with a maximum of 100% (10 blink periods of 10% each) the pattern illustrated in FIG. 21 may be used. The pattern may repeat endlessly, with the time for each field staying constant, but the number of illuminations in the percentage field may change as the parameter changes value. Continuous blinking indicates the parameter is at maximum (100% in this example). Pauses may be optionally inserted between blink periods to aid counting.

Figures 22, 23, 24:
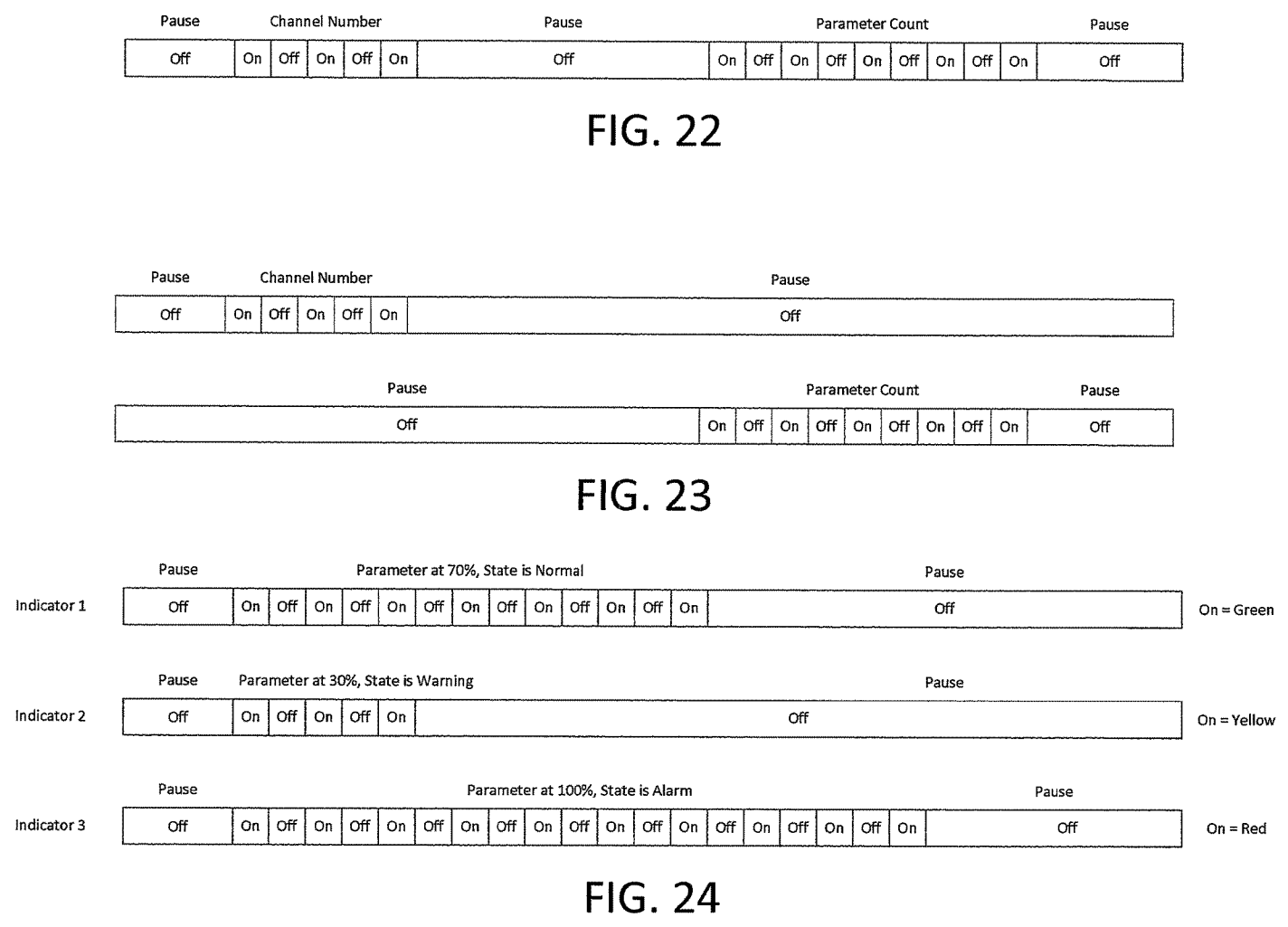

Referring to FIG. 22, devices often measure the same parameter on a plurality of channels, together with a particular color, if desired. It is desirable to use one indicator, two indicators, and/or a number of channels equal to the number of indictors to represent the values. In the case of a single indicator, it is desirable to show parameters, states, or codes for multiple channels. There may be a pause, then the channel number is blinked, followed by another pause, then the parameter and state color is blinked. The indicator rotates through all the active channels. To help the user distinguish the channel number blinks from parameter blinks, these should be done in different colors, reducing the number of colors available to show states. In the example illustrated in FIG. 22, the channel number is 3 and parameter is 5.

Referring to FIG. 23, dual indicators may be used to show channel or parameter number in a similar manner to the single indicator scheme shown in FIG. 22, together with a particular color, if desired. The channel number is blinked on indicator 1, followed by the parameter, states, or codes on indicator 2. There is a pause, then the channel number is blinked on indicator 1, followed by another pause, then the parameter and state color is blinked on indicator 2. The indicators may rotate through all the active channels.

Referring to FIG. 24, there may be an indicator for each parameter and/or channel, together with a particular color, if desired. The product label may identify the relationship between the indicator and the channel or parameter, so no channel indicator is needed. The counts are easier to read if the count and pause time frames are the same for all indicators, keeping the indicator blink time frames synchronized. In the example illustrated in FIG. 24, the parameters are at 70%, 30%, and 100%; with states of Normal, Warning, and Alarm.

A variation may include adding a parameter indicator, which would first blink out a code for which parameter is being displayed, after which the channel indicators would show the value and state of each channel for that parameter. This would go through a short list of parameters round robin fashion.

The system may combine the indications for the parameters, such as combining the blink, duration, and colors to facilitate a single indicator to indicate a (optionally signed) parameter and state information at the same time.

The blink duration may be used with color to indicate an approximate value and add a sign, direction, or status to the indication. The on/off cycle length is constant, but the ratio of the on/off time is varied. In this example the system may have a value that is ratio that can be scaled to the range 1 to 0 or a parameter that varies of a range that can be expressed as a percentage ranging from 100% to 0%. Color can be used to indicate thresholds associated with the value, or other unrelated system states. For example, value ranges from 100% toward 0% may be indicated. As it does so, the status changes from normal, to warning, and then alarm.

Figures 25, 26, 27, 28, 29:
FIG. 25 illustrates a green led indicating a value of approximately 90%.
FIG. 26 illustrates a green led indicating a value of approximately 70%.
FIG. 27 illustrates a green led indicating a value of approximately 50%.
FIG. 28 illustrates a yellow led indicating a value of approximately 20%.
FIG. 29 illustrates a red led indicating a value below 10%.

Referring to FIG. 25, a value above 90% is illustrated together with a green color.

Referring to FIG. 26, a value approximately 70% is illustrated together with a green color as a normal status.

Referring to FIG. 27, a value approximately 50% is illustrated together with a green color as a normal status.

Referring to FIG. 28, a value approximately 20% is illustrated together with a yellow color as a warning status.

Referring to FIG. 29, a value below 10% is illustrated together with a red color as an alarm status.

Two display cycles may be illustrated, such as with a percentage blink count with color. These may repeat endlessly, updating the percentage blink count as needed. The indicator is showing both an alarm state and a percentage of full scale.

Figure 30:
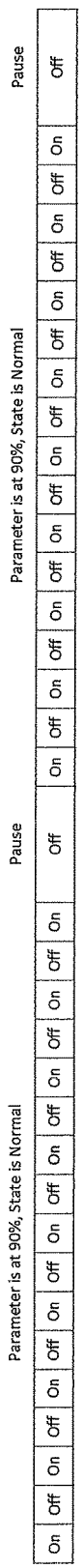
FIG. 30 illustrates a led indicating two cycles at 90% of full scale.

Referring to FIG. 30, the status is Normal (green) and the parameter is at 90% of full scale. Two display cycles are shown, the pattern repeats endlessly, the blink count changes as the parameter changes.

Figure 31:
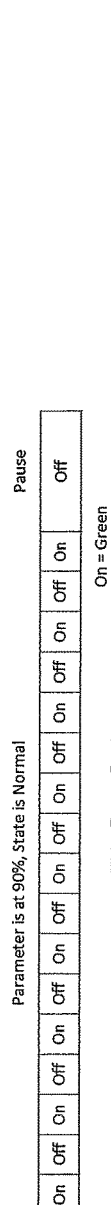
FIG. 31 illustrates a single cycle of FIG. 30.

Referring to FIG. 31, a single cycle of the pattern illustrated in FIG. 30 is illustrated to magnify the blink periods.

Figure 32:
FIG. 32 illustrates a led indicating 30% of full scale.

Referring to FIG. 32, in another example, the status is alarm (red) and the parameter is at 30% of full scale.

Figure 33:
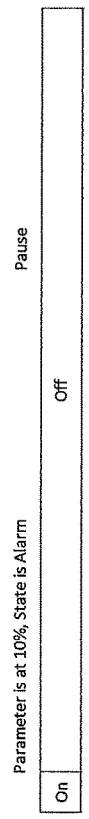
FIG. 33 illustrates a led indicating less than 10% full scale.

Referring to FIG. 33, to indicate a value of much less than 10% and the system may show activity, the duration of the blink is made brief with a duty cycle of much less than 50/50.

Two display cycles may be illustrated, such as with a numeric blink count with color. The value of a parameter can be displayed using an integer count. At the same time, color can be used to show status of this parameter or other system states. The state shown in color need not be related to the parameter. Because the blink envelope is variable in length, pauses may be inserted to show the beginning and end of the blink count cycle.

Figure 34:
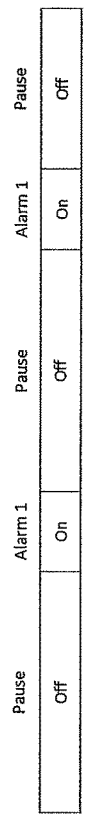
FIG. 34 illustrates a led indicating an alarm value of 1.

Referring to FIG. 34, an exemplary parameter value of 1 is illustrated. The color may be red, to indicate the value is very low, or the system is in an alarm state.

Referring to FIG. 35, an exemplary parameter value of 3 is illustrated. The color may be yellow, to indicate the value is low, or the system is in a warning state.

Referring to FIG. 36, an exemplary parameter value of 8 is illustrated. The parameter or system state is green, to indicate a normal condition. One cycle is illustrated but the pattern preferably repeats.

The display cycles may be illustrated, such as with a numeric value blink with signed duration and color. Both the value and the sign of parameter may be displayed. Color may be used to show status of this parameter or other states.

Referring to FIG. 37, a parameter value of 1 with no sign is illustrated, The color may be green, to indicate the value is normal, or the system is in a running state. The pattern may repeat.

Referring to FIG. 38, a parameter value of −1 is illustrated. The color may be red, to indicate the value is very low or the system is in an alarm state.

Referring to FIG. 39, a parameter value of −3 is illustrated. The color may be yellow, to indicate the value is low or the system is in a warning state.

Referring to FIG. 40, a parameter value of +8 is illustrated. The color may be green, to indicate a normal state.

The display cycles may be illustrated, such as with a percentage with a signed duration and color. Because there a fixed number of blink periods in a cycle, pauses are not required but may be added. The Indicator is showing both an alarm state and a percentage of full scale with sign.

Referring to FIG. 41, a single display cycle is illustrated. There are 10 blink fixed periods in the cycle, at 10% each. The status is alarm (red) and the parameter is at 30% of full scale with a negative value.

Referring to FIG. 42, a status is normal (green) and the parameter is at 90% of full scale with a positive sign.

For energy metering devices, the parameters and states may be selected, such as for example, from the tables illustrated in FIG. 43 and FIG. 44. The states and parameters do not have to be related, although some combinations are more intuitive. Energy meters often measure one to three phases, with each phase having voltage inputs paired with current inputs. For the following examples each of the three phases has an indicator.

Referring to FIG. 43, the parameter values may have a wide range, and may be represented as a blink count, either as a percentage of full scale or as a weighted count. Most of these values have a known range on a given circuit, so they may be then be expressed as a percentage of full scale. They call also be shown as a variable length blink count with each blink having a value such as 1, 2, 5, 10, 20, 50 100, etc.

Referring to FIG. 44, the states have a limited number of possibilities that may be represented as colors. Counts may be used as well, but are less efficient use of indicators, and not as intuitive. These may be applied to individual phases or channels.

The following exemplary examples illustrate an energy meter measuring current and voltage on a circuit with 3 or fewer phases (plus neutral current) that use some of the parameters and states described above. For purposes of illustration the blink cycles are shown as a percentage scale having ten blinks at 10% each. The blinks can be a different scale, such as coarser (such as 5 blinks at 20% each or finer (20 blinks at 5% each). Absolute blink counts may be used as well, for example representing current flow with each blink indicating 10 amps.

The power factor (PF) is typically calculated as the ratio of the Real Power (Watts) divided by the Apparent Power (VA). The Real Power (Watts) has a sign showing the direction of energy flow, while apparent power does not, so the sign of PF follows the direction of energy flow. Positive PF shows energy flow to load, while negative sign shows energy flow back into the grid (co-generation). The maximum value of the ratio is 1, which can be scaled as 100%. Values of PF less than 1 show the amount of phase shift between AC voltage and current. Customers want to know about low power factor, since their power company may penalize them for it. Very Low values around 0.5 and below may show that the voltage and current sensors are miss-associated, a common mistake during installation. Power Factor can be calculated for each phase on a circuit.

Referring to FIG. 45, a unity (100%) Power Factor is represented as 10 blinks at 10% per blink. The sign of PF is shown using duration, with a short duration blink representing negative sign (energy flow to grid) and a long duration representing a positive sign (energy flow to load). Color is used to warn about low power factor, with green for values of +/−0.7 or higher, yellow for +/−0.7 to 0.5, and red for values below +/−0.5. For this example, phase 1 has a PF of +0.9 (positive 90%) and the state is green. Phase 2 has a PF of −0.6 (negative 60%) with a yellow alarm, and phase 3 is at +0.4 with a red (low PF) alarm showing the user a possible miss-wire situation.

The current on each phase may be as a percentage of full scale. Full scale may be the amperage rating of the current sensor, or a breaker size (typically less than or equal to the current sensor rating) set by the installer. Over current warning and alarm thresholds would have defaults that can be reset by the user relative to full scale, either as a percentage or in amps.

Figure 46:
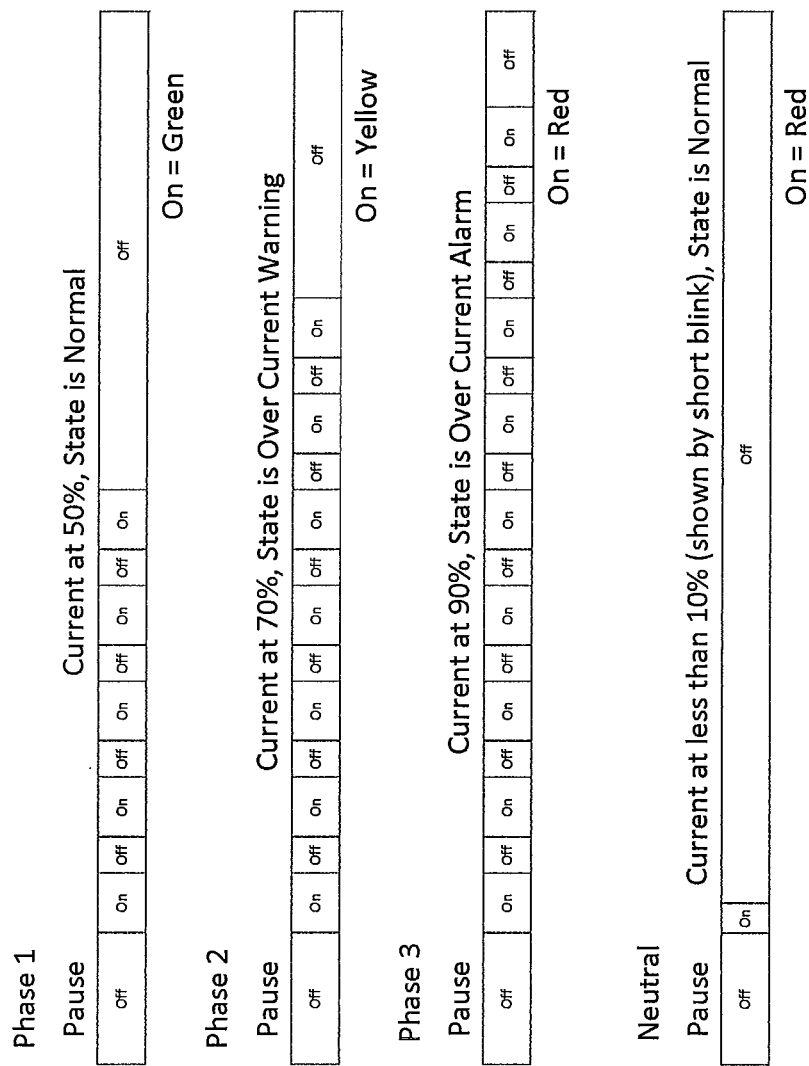
FIG. 46 illustrates a set of led values indicating current alarm levels.

Referring to FIG. 46, each blink represents 10% of full scale current. A single short blink is used to show values less than 10%. This blink gets shorter (fainter) as the current becomes much less than 10%. Full scale is set to either the breaker size or current sensor rating. The over current warning (yellow) threshold is set to be within 40% of full scale, and the over current alarm (red) is set to be within 20% of full scale. Currents less than these thresholds are considered normal (green).

Some parameters have an optimal value around which they vary. Circuit voltage is one such parameter. By way of example, the voltage may be described relative to the circuit nominal. Blink duration is used to indicate if the voltage is above or below nominal. With a 12 blink cycle, each blink can be given a value of 10% of nominal, and up to a 120% over range can be displayed. A pause is no longer need for most applications due to the over range. High or Low Voltage alarm threshold (rather than absolute voltage) are set by the user.

Referring to FIG. 47, for example, high and low warning thresholds are set at + or −10% of nominal, and high and low alarm thresholds are set at + or −20%. These thresholds may be user configurable.

Power may be real (watts), apparent (VA), or reactive (VAR). Which value to display may be selected by the user. The default would may be real power (Watts). The power on each phase may be represented as a percentage of the maximum theoretical power calculated for the phases as: rated current x line to neutral voltage. 100% of full scale would default to the maximum theoretical power, the user may over ride this value. Over/Under power warning and alarm thresholds are set by the user relative to the maximum theoretical power, either as a percentage or in watts. Both under and over power warning and alarm thresholds may be set.

Referring to FIG. 48, for example, full scale is set to the maximum theoretical phase power. The power flow is assumed to be uni-directional (to load) and does not have a sign, allowing the use of blink duration to indicate high or low power. Each blink represents 10% of full scale power. This blink gets shorter (fainter) as the current becomes much less than 10%. The over power warning (yellow) threshold is set to be within 60% of full scale, and the over power alarm (red) is set to be within 80% of full scale. Over power alarms are distinguished by a long blink. Under power alarms are set to be 20% of full scale (red) and 40% of full scale (yellow). Under power alarms are distinguished from over power alarms by using a short duration blink. A single very short blink is used to show values less than 10%. Power levels between the under power (40%) and over power (60%) warning thresholds are considered normal (green).

Referring to FIG. 49, a full scale is set to the maximum theoretical phase power. The power flow may be bi-directional and has a sign. Blink duration is used to indicate direction of energy flow (+ long blink is to load, − short blink is to grid). Each blink represents 10% of full scale power. The over power alarm is red, and the under power alarm is yellow. Over and Under Power Alarms are configured for both up and downstream power directions. In this example both up and down stream alarms are set the same: over power alarm (red) is set to 110% of full scale. Up and down stream under power alarms (yellow) are set to 40% of full scale, Power Levels between the under power and over power warning thresholds are considered normal (green).

Referring to FIG. 50, metering devices may need to indicate state information to users. This can range from informative state information, warning, alarm or error code numbers. These can be coded as numeric values with pauses in between. Color is used to indicate the category: information (green), warning (yellow), or alarm/error/diagnostic (red). The pauses allow an unlimited number of indications to be strung together. The pattern repeats endlessly, showing all active indications.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. An electrical monitoring system comprising:
   (a) a plurality of current sensors suitable to sense current within a respective conductor of a multi-phase circuit;
   (b) a plurality of voltage sensors suitable to sense voltage within a respective said conductor of a multi-phase circuit;
   (c) a first non-binary indication provided by a first binary indicator includes a first light emitting device interconnected to a first one of said plurality of current sensors and a first one of said plurality of voltage sensors configured to indicate a condition of said electrical monitoring system;
   (d) a second non-binary indication provided by a second binary indicator includes a second light emitting device interconnected to a second one of said plurality of current sensors and a second one of said plurality of voltage sensors configured to indicate a condition of said electrical monitoring system;
   (e) wherein each of said first non-binary indication and said second non-binary indication includes a plurality of states, one of said states indicating a value is satisfied and another one of said states indicating a value is not satisfied;
   (f) wherein said first and second light emitting devices selectively emit a respective blinking light of a selected number of blinks to indicate whether a first state is satisfied;
   (g) wherein said first and second light emitting devices selectively emit said respective blinking light having a variable duration indicating whether a second state is satisfied;
   (h) wherein said first and second light emitting devices selectively emit said respective blinking light having a variable color indicating whether a third state is satisfied;
   (i) wherein said first and second blinking light simultaneously emit said selected number of blinks with said variable duration and said variable color.

2. The electrical monitoring system of claim 1 wherein said variable color includes red, yellow, and green and said third state is power factor.

3. The electrical monitoring system of claim 1 wherein said first and second light emitting devices selectively emit said respective blinking light of blinks indicating a power factor in tenths.

4. The electrical monitoring system of claim 1 wherein said first and second light emitting devices selectively emit a respective blinking light having a variable color indicating whether a third state is satisfied, wherein said third state is power factor.

5. An electrical monitoring system comprising:
   (a) a plurality of current sensors suitable to sense current within a respective conductor of a multi-phase circuit;
   (b) a plurality of voltage sensors suitable to sense voltage within a respective said conductor of a multi-phase circuit;
   (c) a first non-binary indication provided by a first binary indicator interconnected to a first one of said plurality of current sensors and a first one of said plurality of voltage sensors configured to indicate a condition of said electrical monitoring system;
   (d) a second non-binary indication provided by a second binary indicator interconnected to a second one of said plurality of current sensors and a second one of said plurality of voltage sensors configured to indicate a condition of said electrical monitoring system;
   (e) wherein each of said first non-binary indication and said second non-binary indication includes a plurality of states, one of said states indicating a value is satisfied and another one of said states indicating a value is not satisfied:
(f) wherein first non-binary indication indicates said plurality of states based upon a plurality of light emitting devices;
(g) wherein said plurality of states includes illumination of four of said plurality of light emitting devices.

6. The electrical monitoring system of claim 5 wherein said plurality of light emitting devices includes at least four different colors of a red light emitting device, a green light emitting device, a yellow light emitting device, and a blue light emitting device.

\* \* \* \* \*

UNITED STATES PATENT AND TRADEMARK OFFICE
CERTIFICATE OF CORRECTION

PATENT NO. : 10,001,513 B2
APPLICATION NO. : 15/097832
DATED : June 19, 2018
INVENTOR(S) : Parker et al.

Page 1 of 1

It is certified that error appears in the above-identified patent and that said Letters Patent is hereby corrected as shown below:

In the Specification

Column 1, Line 22: Delete "etc. which" and replace with --etc., which--;

Column 3, Line 61: Delete "However due" and replace with --However, due--;

Column 9, Line 29: Delete "illustrated," and replace with --illustrated.--; and

Column 9, Line 43: Delete "Indicator" and replace with --indicator--.

Signed and Sealed this
Twenty-ninth Day of October, 2019

Andrei Iancu
*Director of the United States Patent and Trademark Office*